United States Patent [19]

Tanaka

[11] Patent Number: 5,331,597
[45] Date of Patent: Jul. 19, 1994

[54] SEMICONDUCTOR NONVOLATILE MEMORY APPARATUS INCLUDING THRESHOLD VOLTAGE SHIFT CIRCUITRY

[75] Inventor: Sumio Tanaka, Tokyo, Japan

[73] Assignee: Kabushiki Kaisha Toshiba, Kawasaki, Japan

[21] Appl. No.: 677,450

[22] Filed: Mar. 29, 1991

[51] Int. Cl.⁵ .................... G11C 7/06; G11C 11/407
[52] U.S. Cl. .................................. 365/207; 365/208; 365/190
[58] Field of Search ............... 365/207, 208, 205, 190

[56] References Cited

U.S. PATENT DOCUMENTS

| | | | |
|---|---|---|---|
| 3,461,318 | 8/1969 | Ordower | 365/207 X |
| 4,393,475 | 7/1983 | Kitagawa et al. | 365/207 X |
| 4,959,814 | 9/1990 | Cho et al. | 365/207 |
| 4,984,204 | 1/1991 | Sato et al. | 365/208 X |

Primary Examiner—Benny Lee
Attorney, Agent, or Firm—Banner, Birch, McKie & Beckett

[57] ABSTRACT

A semiconductor nonvolatile memory apparatus is composed of differential cells in which data can be written electrically, data reading sense amplifiers for reading data from these cells, and threshold voltage shift checking sense amplifier connected to respective sense inputs of the sense amplifiers through selecting switching elements and checking threshold voltages of respective transistors within the differential type cells. According to this semiconductor nonvolatile memory apparatus, data can be read out at high speed without increasing the chip size.

6 Claims, 6 Drawing Sheets

|  | LOGIC LEVEL FOR SELECTING LEFT CELL 11 | LOGIC LEVEL FOR SELECTING RIGHT CELL 12 | LOGIC LEVEL IN NORMAL READING MODE |
|---|---|---|---|
| $Ax1/\overline{Ax1}$ | "1"/"0" | "0"/"1" | "1"/"1" |
| $Ax2/\overline{Ax2}$ | "1"/"0" | "0"/"1" | "0"/"0" |
| $Ax3/\overline{Ax3}$ | "1"/"0" | "0"/"1" | "1"/"1" |

FIG. 2
PRIOR ART

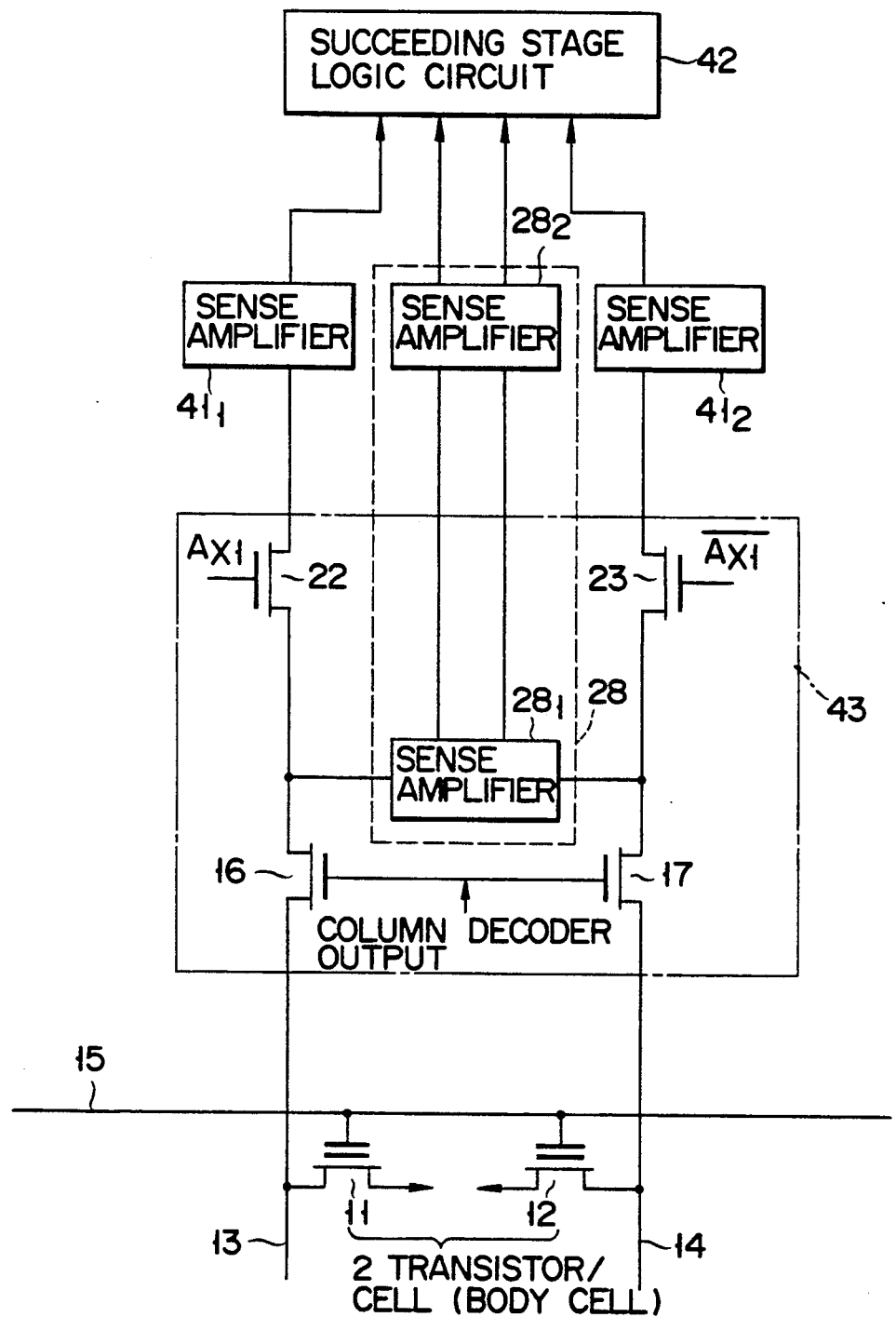
F I G. 3

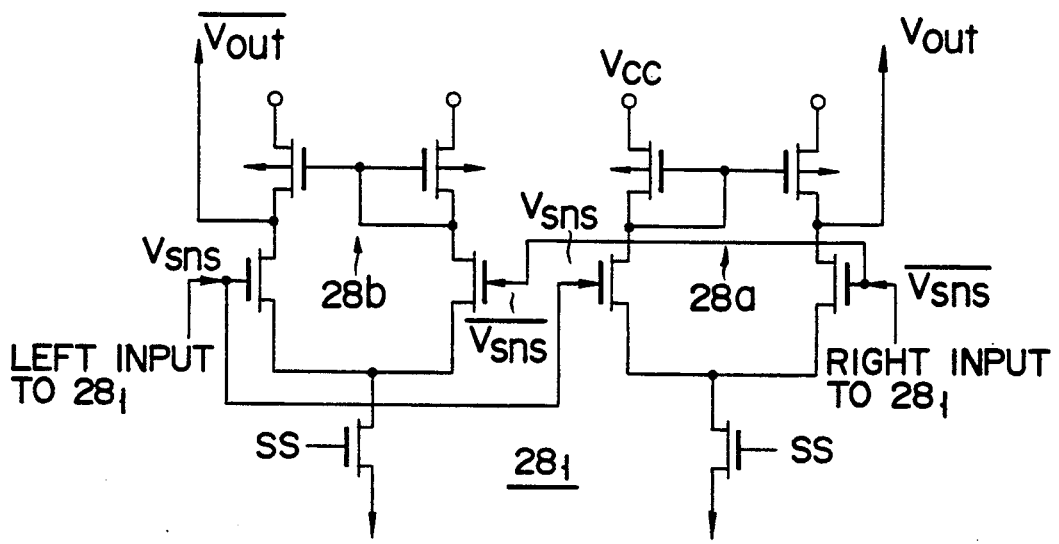
F I G. 5
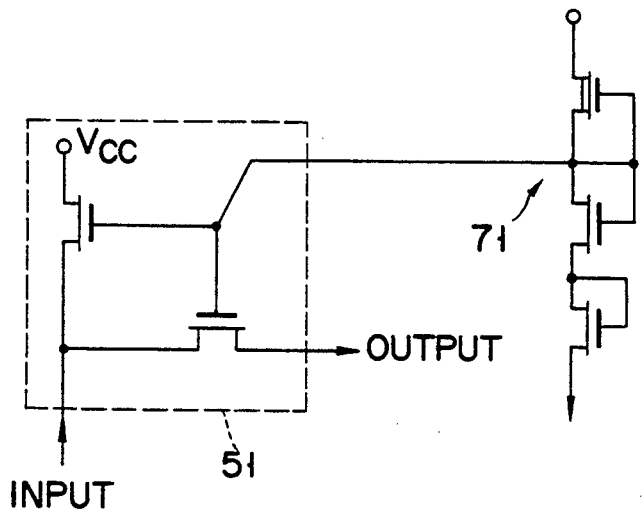
F I G. 6
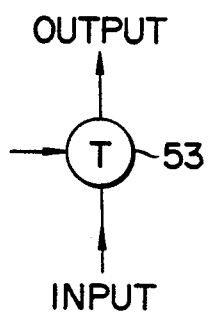
F I G. 7A
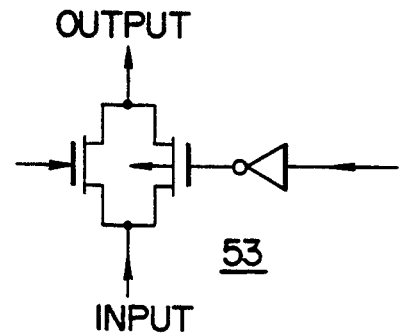
F I G. 7B

SEMICONDUCTOR NONVOLATILE MEMORY APPARATUS INCLUDING THRESHOLD VOLTAGE SHIFT CIRCUITRY

BACKGROUND OF THE INVENTION

1. Field of the Invention

The present invention relates to a semiconductor nonvolatile memory apparatus having a differential type cell in which data can be electrically written.

2. Description of the Related Art

A differential type cell for use in a nonvolatile semiconductor memory apparatus, may be formed a using two transistors/cell as illustrated in FIG. 1. In this example, the cell employs an N channel FAMOS (Floating gate Avalanche injection MOS) used in an ultraviolet erasable read only memory (EPROM).

In FIG. 1, reference numerals 11 and 12 designate transistors of N channel FAMOS configuration which constitute the two transistors of the differential memory cell. In the normal mode, one of the transistors 11 and 12 is in its ON state and the other is in its OFF state. Reference numerals 13 and 14 designates a pair of bit lines, 15 a word line and 16 and 17 column selecting transistors, respectively.

Further, in FIG. 1, reference numerals 18 and 19 designate dummy cells (placed in ON state constantly), 20 and 21 N channel transistors, 22 and 23 body cell selecting transistors, 24 and 25 dummy cell selecting transistors, 26 and 27 bias circuits for carrying out the level shift, 28 a differential amplifier type sense amplifier, 29 and 30 load transistors, 31 and 32 or 33 and 34 load adjusting transistors and 35 and 36 sense lines, respectively. $A_{X2}$ is a gate input signal for switching dummy cell selecting transistor 24 and $A_{X2}$ is a gate input signal for switching dummy cell selecting transistor 25. $A_{X3}$ is a gate input signal for switching load adjusting transistor 31 and $/A_{X3}$ is a gate input signal for switching load adjusting transistor 33. The output of a column decoder (not shown) is applied to the gates of column selecting transistors 16 and 17 for selecting bit lines 13 and 14. When the transistor 31 is turned ON in the test mode, the transistor 31 and the circuit of the transistor 32 become parallel to the transistor 29 to thereby increase the potential of the sense line. The transistors 30, 33 and 34 are placed in a similar relationship.

In the circuit of FIG. 1, the two transistors/cell of the transistors 11 and 12 are differentially operated such that one is operated as ON cell (non-programmed cell) and the other is operated as OFF cell (programmed cell) to supply the potential through the bit line and the bias circuit to the sense lines 35 and 36. Since the cells are operated differentially, the bit lines 13, 14 and the sense lines 35, 36 also are operated differentially, whereby the content of the cell can be propagated at high speed by the sense amplifier 28.

In the above-mentioned two transistors/cell system, the two transistors are operated differentially so that, if the threshold voltage is increased by a very small threshold voltage shift in the DC operation, then the sense amplifier 28 determines that the writing is finished. However, in the high speed access mode, that is, the AC operation mode, a constant amount of the threshold voltage shift is necessary, and in order to check the reliability, it is important to monitor the threshold voltage shift in the cell. In the die sort stage of the manufacturing process or in a commercially available programmer (writing device), the threshold voltage shift is generally checked in substantially the DC operation at low speed. In FIG. 1, in addition to the body cell, the dummy cells 18 and 19 are provided to check the above-mentioned threshold voltage shift. Logic levels of the signals relevant thereto at that time are represented in FIG. 2. If the logic levels are selected as shown in FIG. 2, then an intermediate level occurs in the level of the sense line (35 or 36) of the side which is not checked to thereby check the content of the cell.

In such conventional circuit, the switching transistors 22 and 23 whose gate inputs are $A_{xl}$, $\overline{A_{xl}}$ must be provided between the bit line and the sense line. However, these switching transistors 22 and 23 operate as resistance elements to cause the speed of the bit line data to be decreased.

Accordingly, in order to omit the above-mentioned transistors 22 and 23, the column decoder may be divided into left and right column decoders to carry out the above-mentioned operation. In this case, however, the threshold voltage shift of the column decoder outputs is doubled (the wiring is generally made by a bilayer aluminum at a large pitch), which becomes disadvantageous from an integrated circuit area standpoint. Further, since the dummy cell and a peripheral transistor are manufactured by different manufacturing processes, the dummy cell and the peripheral circuit must be isolated by a constant distance, which unavoidably results in a large integrated circuit area.

SUMMARY OF THE INVENTION

Accordingly, it is an object of the present invention to improve problems of read-out speed and integrated circuit area.

In order to attain the above-mentioned object, a semiconductor nonvolatile memory of the present invention is composed of differential type cells into which data can be written electrically, a sense amplifier for reading out data from these cells, and a threshold voltage shift checking sense amplifier connected to sense inputs of this sense amplifier through a selecting switching element and checking a threshold voltage of the transistor provided in each of the cells.

More specifically, in accordance with the present invention, in addition to the data read-out sense amplifier, a threshold voltage shift checking sense amplifier is provided to check the threshold voltage shift, whereby the switching transistor, which operates as the resistance in the prior art, can be removed from the bit line system, thereby the read-out speed being increased. Further, a multilayer metal wiring system is employed and the wirings of high resistance polycide, polysilicon or the like are made in different layers, to thereby prevent the area of the integrated circuit from being increased. Further, the number of dummy cell circuit systems which require a large area is reduced and a few dummy cell circuits (reference voltage generating circuits for sense amplifiers) are disposed outside of a section circuit in which the element wirings are congested. Thus, an increase in the area of the integrated circuit can be prevented.

The above, and other objects, features and advantages of the present invention will become apparent from the following detailed description of an illustrative embodiment to be taken in conjunction with the accompanying drawings, in which like reference numerals are used to identify the same or similar parts in the several views.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a table of logic levels to which references will be made in explaining operation of the conventional semiconductor nonvolatile memory circuit;

Figure 4:
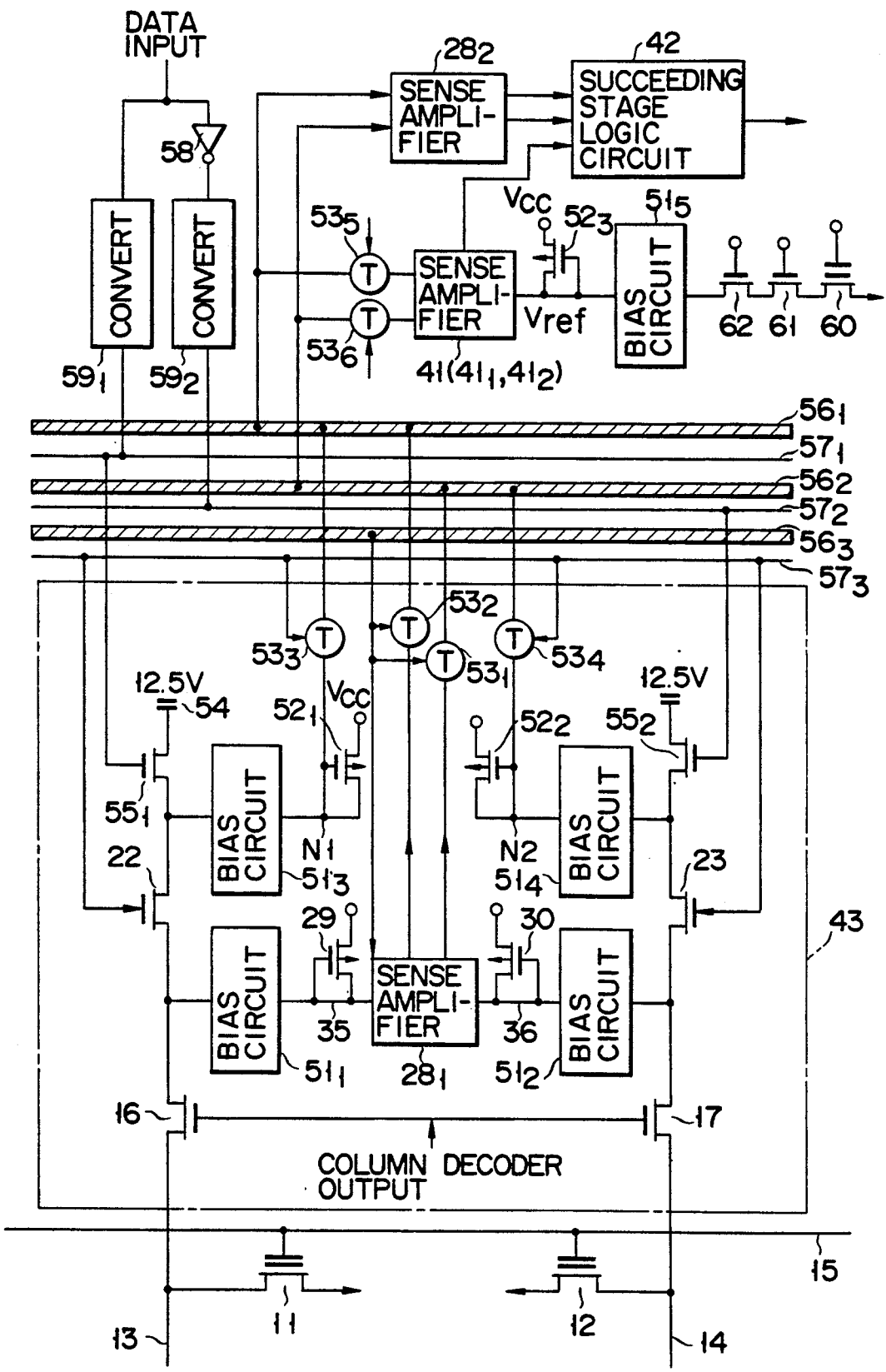

Fig, 3 is a schematic block diagram showing a semiconductor nonvolatile memory apparatus according to an embodiment of the present invention;

FIG. 4 is a circuit diagram showing the semiconductor nonvolatile memory apparatus more fully;

FIG. 5 is a schematic diagram of a sense amplifier for use in the apparatus of FIG. 4.

FIG. 6 is a schematic diagram of a bias circuit for use in the apparatus of FIG. 4.

FIG. 7A and 7B are schematic diagrams of a transfer gate for use in the apparatus of FIG. 4.

Figure 8:
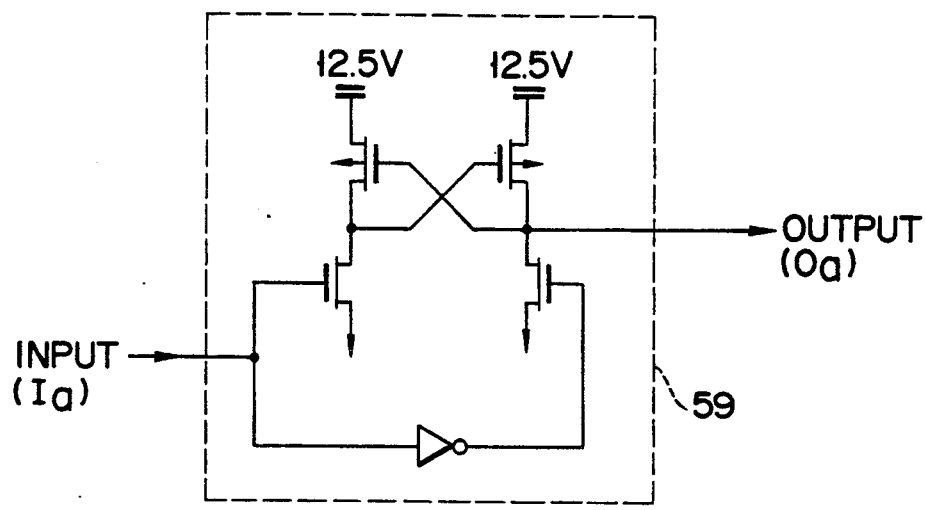

FIG. 8 is a schematic diagram of a converting circuit for use in the apparatus of FIG. 4.

Figure 9:
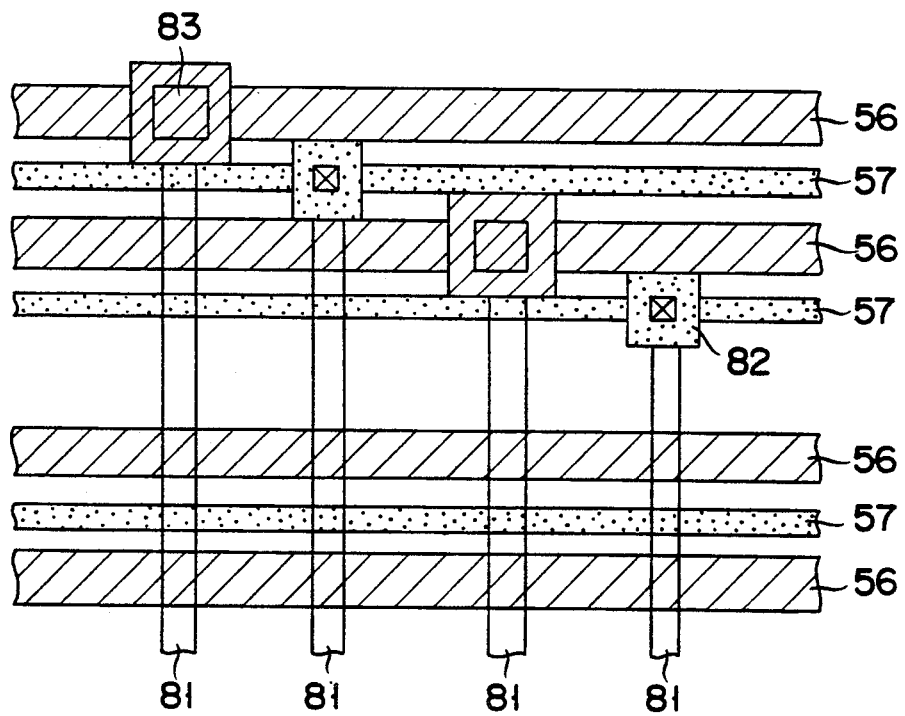

FIG. 9 is a plan view of a pattern of one portion of the arrangement of the same circuit.

DETAILED DESCRIPTION OF THE PREFERRED EMBODIMENTS

Figure 1:
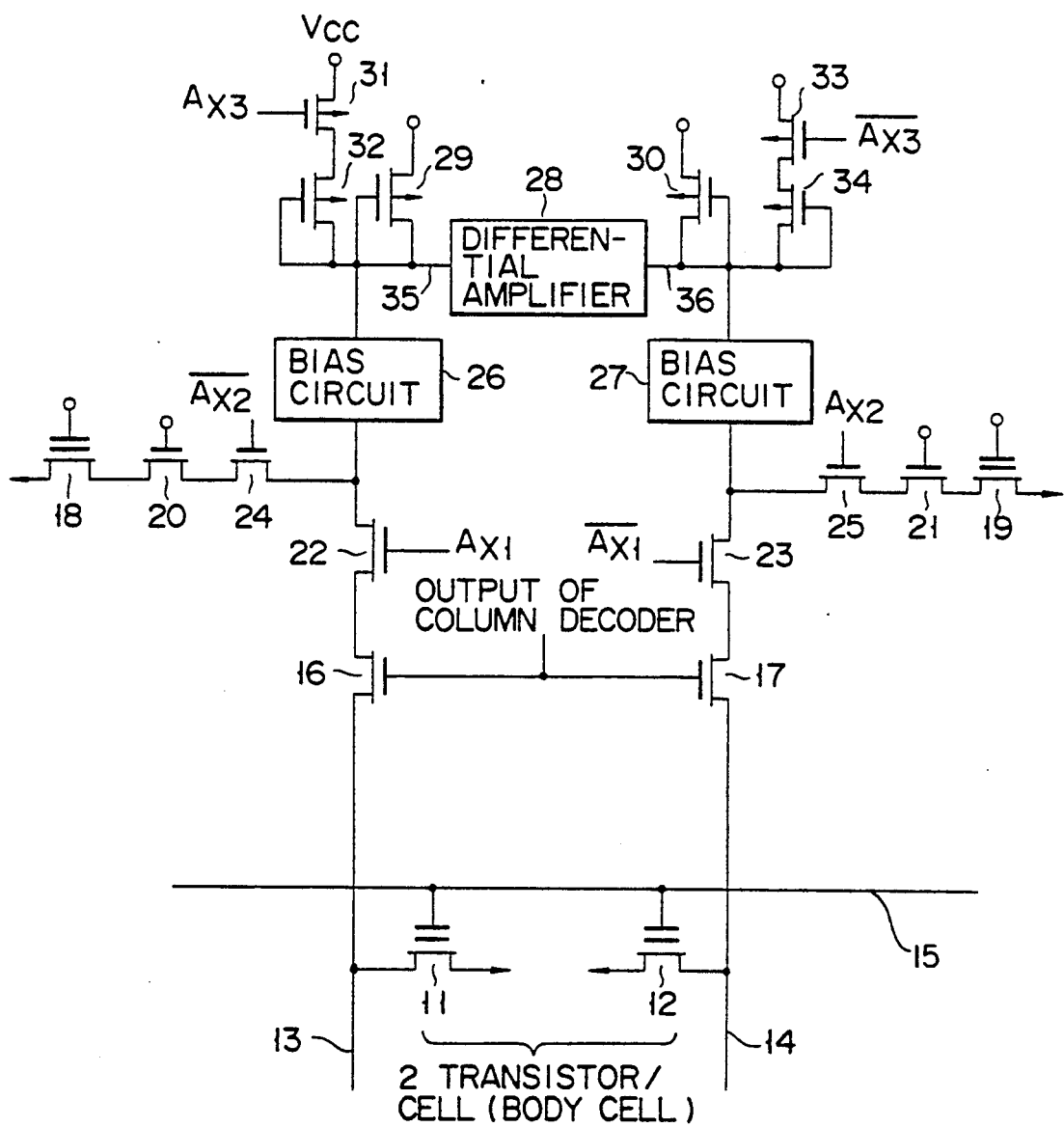
FIG. 1 is a schematic circuit block diagram showing a conventional semiconductor nonvolatile memory circuit.

An embodiment of the present invention will hereinafter be described with reference to the drawings. FIG. 3 is a schematic diagram showing an arrangement of this embodiment and this figure of drawing corresponds to FIG. 1, so like parts corresponding to those of FIG. 1 are marked with the same reference numbers.

Referring to FIG. 3, the sense amplifier 28 as the voltage detecting circuit is used to read-out the data, and sense amplifiers $41_1$ and $41_2$ are used to check the data writing amount. The sense amplifier 28 is formed of two-stage configuration composed of sense amplifiers $28_1$ and $28_2$. Outputs of the sense amplifiers $28_2$, $41_1$ and $41_2$ are input to a succeeding stage logic circuit 42. A one-dot chain line block 43 represents a section circuit in which element wirings are congested. The transistors 22 and 23 are used to select the threshold voltage shift checking sense amplifiers $41_1$ and $41_2$ and the threshold voltage shift herein includes a threshold voltage condition of the cell which is not placed in the writable condition.

In accordance with the circuit arrangement of FIG. 3, since the transistors 22 and 23 are removed from the sense amplifier 28 and the bit lines 13, 14, the resistance values can be decreased, thus making it possible to perform the high speed reading.

FIG. 4 is a schematic diagram showing more specifically the circuit of FIG. 3. Drawing elements in FIG. 4 that are similar to those in FIGS. 1 and 3 are identified with the same reference numerals and/or legends.

In FIG. 4, reference numerals $51_1$, $52_1$, $53_1$, and $54_1$ designate bias circuits, 29, 30, $52_1$, $52_2$ and $52_3$ designate loads, each having a terminal coupled to a power source potential Vcc, $53_1$, $53_2$, $53_3$, $53_4$, $53_5$ and $53_6$ designate transfer gates, 54 a terminal to which a writing high voltage (e.g. 12.5 V) is applied, and $55_1$ and $55_2$ transistors which supply this high voltage. Reference numerals $56_1$, $56_2$ and $56_3$ designate second layer aluminum layers in the high speed reading system of the semiconductor circuit, and $57_1$, $57_2$, and $57_3$ designate polycide (or high resistance wirings such as polysilicon or the like) layers in the threshold voltage shift detecting system of the semiconductor circuit. The second layer aluminum layer $56_3$ is used as the signal line which selects the read-out sense amplifier and the polycide layer $57_3$ is used as the signal line which selects the transfer gate through which the signal is transmitted to the threshold voltage shift checking sense amplifier. Reference numeral 58 designates an inverter and $59_1$ and $59_2$ converting circuits which convert voltages to high voltages, and if the DATA INPUT is 0 V, the voltage is converted to 0 V and if the data input is 5 V, this voltage is converted to 12.5 V. A dummy cell 60, transistors 61, 62, the bias circuit $51_5$ and the transistor $52_3$ are used to supply a reference voltage $V_{ref}$ to the sense amplifier 41. In this embodiment, the load $52_3$ is smaller in impedance than the loads $52_1$ and $52_2$, the dummy cell 60 is in its non-writable condition and in its ON state. Accordingly, by comparing the reference voltage $V_{ref}$ with voltages at nodes N1 and N2, it is possible to detect the programmed/non-programmed states of the cells 11 and 12. It is needless to say that the respective aluminum layers, the polycide layers or the like may be formed by the conventional multilayer wiring technique.

FIG. 5 shows an example of a specific circuit of the sense amplifier $28_1$ of FIG. 4 in which a signal $V_{sns}$ is an input signal supplied to sense amplifier 28a and constitutes the left input to sense amplifier $28_1$, and a signal $/V_{sns}$ is an input signal supplied to sense amplifier 28b and constitutes the right input to sense amplifier $28_1$. Although differential amplifiers 28a and 28b both sense-amplify a potential difference between the bit lines 13 and 14 at a timing in which a signal SS is established, the amplifier 28a derives a positive output $V_{out}$ and the amplifier 28b derives an inverted output $\overline{V_{out}}$. Vcc represents a power source potential, e.g., 5 V.

FIG. 6 shows an example of the specific arrangement of the bias circuit $51_1$ to $51_5$ of FIG. 4 by reference numeral 51 receives an input signal INPUT. The bias circuit 51 is controlled by a control section 71 to restrict the potential of the output signal OUTPUT.

FIGS. 7A and 7B show a specific example of the transfer gate 53 shown in FIG. 4, wherein FIG. 7A shows a symbolic representation and FIG. 7B shows a diagram of a practical circuit receiving an input signal INPUT and outputting an output signal OUTPUT. FIG. 8 shows a specific example of the converting circuits $59_1$ and $59_2$ of FIG. 4 by reference numeral 59. This circuit 59 derives an output $O_a$ of 0 V when the input $I_a$ is 0 V and derives an output $O_a$ of 12.5 V when the input $I_a$ is 5 V. FIG. 9 generally shows a pattern diagram of the wiring portion of FIG. 4. In FIG. 9, reference numeral 56 designates a second layer aluminum wiring on the integrated circuit substrate, 57 a high resistance wiring such as polycide or the like, 81 a first layer aluminum wiring, 82 a ordinary contact portion and 83 a via-contact portion. While the respective layer wiring are disposed in a planar fashion in FIG. 9, the layers are different so that the multilayer arrangement can be established, in which insulating lines are provided between the layers.

In the normal reading mode of FIG. 4, data is previously written in the cells 11 and 12, data is derived from the cells 11 and 12 to the bit line, a difference therebetween is detected and amplified by the sense amplifier $28_1$, further amplified by the sense amplifier $28_2$ and then data is supplied to the logic circuit 42.

The threshold voltage shift of the cell 11 is checked by comparing the voltage delivered from the cell 11 through the transistors 16, 22, the bias circuit $51_3$ and the transfer gates $53_3$ and $53_5$ with the reference voltage $V_{ref}$ by the sense amplifier 41 (one of the sense amplifiers $41_1$ and $41_2$). Further, the threshold voltage shift of the cell 12 is checked by comparing the voltage supplied from the cell 12 through the transistors 17, 23, the bias circuit $51_4$ and the transfer gates $53_4$ and $53_6$ with the reference voltage $V_{ref}$ by the sense amplifier 41 (one of sense amplifiers $41_1$ and $41_2$).

According to the circuit arrangement of FIG. 4, there is an advantage that this circuit arrangement is advantageous in chip area in addition to the increase of the read-out speed described in connection with FIG. 3. More specifically, the dummy cell circuit, which causes the area to be increased, may be realized by one cell 60, and the transistors 31 to 34 of FIG. 1 are unnecessary. Further, as shown in FIG. 4, the above-mentioned dummy cell circuit and the sense amplifiers $28_2$ and 41, etc., are disposed outside of the section circuit 43 in which the wiring is congested. In addition, the propagation delay in the writing system circuit and in the signal line $57_3$ need not be made at high speed unlike the ordinary read-out system from a function standpoint. Accordingly, as described above in FIG. 9, if the polycide or polysilicon wiring of resistance higher than Al and different from the second Al layer 56 is provided in different layers from those of the second layer Al layer 56 to thereby transmit the signal, an apparatus can be realized without increasing the chip size.

The present invention is not limited to the above-mentioned embodiment and various changes and modifications thereof could be effected. For example, the sense amplifier 41 may be a differential amplifier and if the sense amplifier 41 is replaced with a single type sense amplifier such as an inverter or the like, then similar detection can be carried out. Further, the present invention may be also be applied to other nonvolatile memory having a differential cell type electrically writable function.

As set forth above, according to the present invention, it is possible to obtain a semiconductor non-volatile memory apparatus having a differential type cell in which data can be written electrically and in which high speed reading can be effected without increasing the chip size.

Having described a preferred embodiment of the invention with reference to the accompanying drawings, it is to be understood that the invention is not limited to that precise embodiment and that various changes and modifications thereof could be effected by one skilled in the art without departing from the spirit or scope of the invention as defined in the appended claims.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device, comprising:
   a differential memory cell for storing data and including a first transistor having a first threshold voltage and a second transistor having a second threshold voltage;
   a first bit line connected to said first transistor;
   a second bit line connected to said second transistor;
   a first column selecting transistor having a first terminal connected to said first bit line and a gate thereof receiving a column selection signal;
   a second column selecting transistor having a first terminal connected to said second bit line and a gate thereof receiving said column selection signal;
   a data reading sense amplifier for reading data from said memory cell and having a first input connected to a second terminal of said first column selecting transistor and a second input connected to a second terminal of said second column selecting transistor;
   threshold voltage shift detecting circuitry including first and second threshold voltage shift detecting sense amplifiers for detecting threshold voltage shifts of said first and second transistors, respectively;
   a first switching element connected in series between said first threshold voltage shift checking circuit and said first input of said data reading sense amplifier; and
   a second switching element connected in series between said threshold voltage shift checking circuit and said second input of said data reading sense amplifier.

2. The semiconductor memory device according to claim 1, further comprising:
   a data writing circuit connected to said differential memory cell.

3. The semiconductor memory device according to claim 2, further comprising a multi-layer wiring including metal wirings and high resistance wirings, wherein said high resistance wirings are connected to said data writing circuit and to said differential memory cell to allow the writing of data from said data writing circuit to said differential memory cell and wherein said metal wirings are connected to said data reading sense amplifier to read out data therefrom.

4. The semiconductor memory device according to claim 1, in which said first transistor is in an ON state, said second transistor is placed in an OFF state, and said second bit line is in an inverted potential relation with said first bit line.

5. The semiconductor memory device according to claim 4, further comprising means, including said first and second switching elements, for selectively comparing voltages at a plurality of resistive loads, and in which in addition to said differential memory cell, a dummy cell is connected to a third load having a resistance value which is smaller than respective resistance values of a first and second load, said first and second loads being respectively connected to first and second nodes which are connected to said first and second bit lines, and said third load is taken as a reference voltage.

6. The semiconductor memory device according to claim 1, wherein said first and second threshold voltage shift detecting sense amplifier and a sense amplifier reference voltage generating circuit are located at a first location and said data reading sense amplifier, said first and second switching elements, and said first and second column selecting transistors are located at a second location different from said first location.

* * * * *